Sept. 19, 1961 A. MARTINEZ 3,001,086

LINEAR SWEEP CIRCUIT ARRANGEMENTS

Filed March 30, 1960

INVENTOR

Antonio Martinez

BY

Baldwin & Wight

ATTORNEYS

United States Patent Office 3,001,086
Patented Sept. 19, 1961

3,001,086

LINEAR SWEEP CIRCUIT ARRANGEMENTS

Antonio Martinez, Chelmsford, England, assignor to Marconi's Wireless Telegraph Company Limited, London, England, a British company Filed Mar. 30, 1960, Ser. No. 18,669
Claims priority, application Great Britain July 20, 1959
7 Claims. (Cl. 307—88.5)

This invention relates to linear sweep circuit arrangements and more particularly to so-called "bootstrap" transistor circuit arrangements of the kind in which there are two transistors of which the first has its output electrode connected to a load so as to produce thereacross a potential which is a replica of its base potential, said base potential being determined by the charge in a first condenser, which, during the "sloping flank" of the saw-tooth waveform produced by the arrangement, is charged at substantially constant current from a second condenser connected between the base and the output circuit, the second transistor being normally cut-off but arranged to be rendered conductive by timing pulses so as to discharge said first condenser during the "flyback" part of the saw-tooth waveform, the said second condenser re-charging during these periods.

Figure 1:
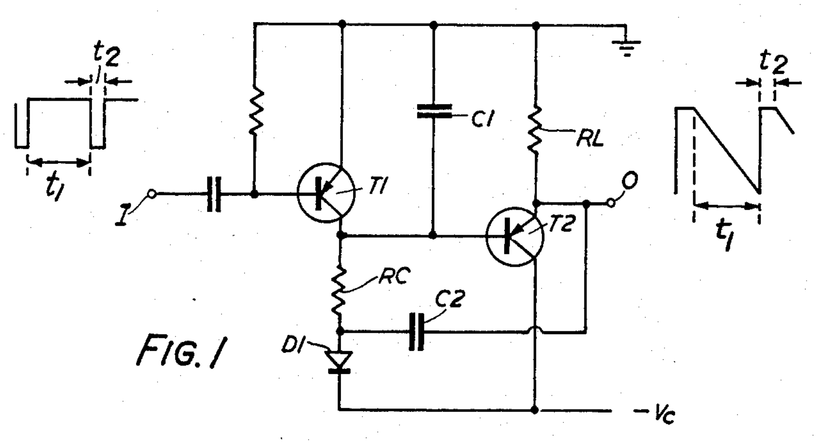
Figure 2:
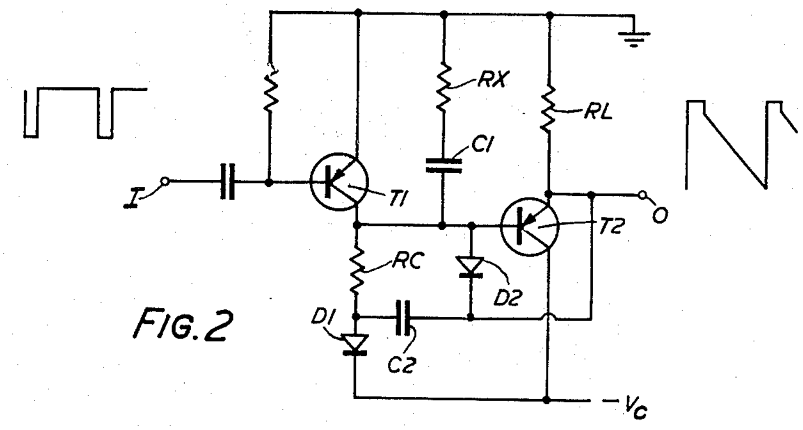
Figure 3:
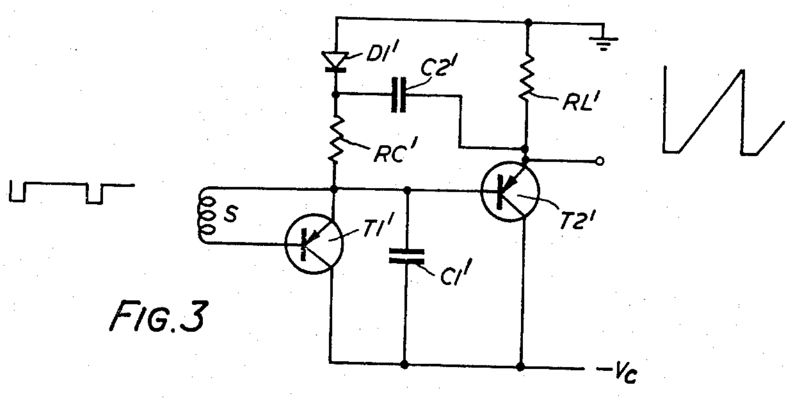

The invention is described with reference to the accompanying drawings of which FIG. 1 is a circuit diagram of a transistor "bootstrap" circuit as at present known; FIG. 2 is a circuit diagram of an arrangement in accordance with one feature of the present invention and FIG. 3 shows an arrangement in accordance with a second feature of this invention.

Referring to FIG. 1, T2 is a transistor connected as an emitter-follower having substantially unity gain. The emitter of this transistor is connected to earth through the load resistance RL, its collector is returned to a negative D.C. supply $-Vc$ and an integrating condenser C1 is connected between the base and earth. Between the base and emitter are connected a resistance RC and coupling condenser C2 in series, the junction point of the resistance RC with the coupling condenser C2 being connected to the negative supply $-Vc$ via a diode D1. Across the condenser C1 is connected a further transistor T1 having its collector connected to the base of transistor T2, its emitter earthed, and its base A.C. coupled to a source (not shown) of timing pulses. Typical input and output waveforms are shown adjacent the input terminal I and the output terminal O, respectively.

At the beginning of period $t_1$, the condenser C2 is fully charged to the potential $-Vc$ and the input wave is such as to cause the transistor T1 to cut off and therefore to present a substantially open-circuit across C1. Condenser C2, which is sufficiently large to maintain a substantially constant potential across its terminals throughout the period $t_1$, discharges through the resistance RC thus causing the condenser C1 to charge. Due to the emitter follower connection of the transistor T2 the gain of this transistor is substantially unity and the potential of the emitter of T2 follows that of the base with the result that the charging current through RC remains constant and the negative potential across C1 increases linearly. Thus the potential at the emitter of T2 and hence at the output terminal O decreases linearly towards $-Vc$. Throughout $t_1$ the diode D1 is cut-off.

At the end of the period $t_1$ the input pulse causes T1 to switch on and C1 is discharged at a rate depending on the collector current of T1. T1 is then "bottomed" and the base of T2 is now substantially at earth potential. At this moment, due to the charge lost by the condenser C2 the emitter of T2 is negative with respect to its base and T2 is cut-off. Again because of the charge lost by C2 the diode D1 conducts and C2 then recovers in the period $t_2$, through the diode D1 and the resistance RL, the charge lost during the period $t_1$.

This and other known circuit arrangements of the kind referred to have the defect that, if the flyback period ($t_2$) is short, it is difficult to secure the required full re-charging of the second, or coupling, condenser during flyback periods without either making the output load resistance of undesirably low value or returning that resistance to a point of specially provided potential. This defect arises because, in the said known arrangements, the charging circuit includes the output load resistance. This defect could be avoided by shunting the load resistance by a normally non-conductive extra transistor and applying the timing pulses to render this transistor conductive during flyback periods, but this expedient has the defect of involving the added cost of the extra transistor with its circuitry.

It is the object of this invention to provide "bootstrap" transistor circuit arrangements of the kind referred to which will overcome the above-mentioned defects with little or no extra cost.

According to this invention the "flyback" period charging circuit of the second condenser of a "bootstrap" transistor circuit arrangement of the kind referred to extends through one of the normally provided two transistors and does not include the load resistance. According to a feature of this invention a "bootstrap" transistor circuit arrangement of the kind referred to is provided with a unilaterally conducting device included, in series with the collector-emitter path of the second transistor, in a "flyback" period charging circuit of the second condenser.

Preferably the unilaterally conducting device is a diode having low forward resistance.

Preferably a linear sweep circuit arrangement in accordance with one feature of this invention comprises a first transistor having a load resistance connected between its emitter and a point of reference potential, its collector connected to a source of direct current potential different from said reference potential and its base connected to said point of reference potential via a path including an integrating condenser; a charging resistance and a coupling condenser connected in series between the emitter of the first transistor and the terminal of said integrating condenser remote from the point of reference potential; a first diode connecting the common junction of the charging resistance and the coupling condenser to said source; a second transistor having its collector-emitter path connected between the base of said first transistor and said point of reference potential; means for rendering said second transistor periodically alternately conducting and non-conducting and a second diode connected between the base and emitter of said first transistor, the whole arrangement being such that when the second transistor is non-conducting the integrating condenser is charged at substantially constant current from said coupling condenser and when the second transistor is conducting the integrating condenser is discharged and the coupling condenser recovers the charge it has lost via a path including both said diodes and the collector-emitter path of said second transistor.

Preferably a further resistance is connected in series with said integrating condenser on the side thereof nearer said point of reference potential.

According to a second and preferred feature of this invention a linear sweep circuit arrangement comprises a first transistor connected to produce across an output load between its emitter and a point of reference potential, a potential which is a replica of the potential on its base; means for determining the potential of said base in dependence on the charge in a condenser connected between said base and a source of direct current potential different from said reference potential, and which is charged at substantially constant current during the "sloping flank" of the saw-tooth waveform produced by the whole arrangement from a second condenser connected between the base and the output circuit; and a second transistor which is normally cut off but is arranged to be rendered conductive by timing pulses so as to discharge the first condenser during the "flyback" part of the saw-tooth waveform, the second condenser re-charging during these periods through a path including the collector-emitter path of said first transistor and excluding the output load.

Preferably an arrangement in accordance with a second feature of this invention comprises a first transistor hava load resistance connected between its emitter and a point of reference potential, its collector connected to a source of direct current potential different from said reference potential and its base connected to said source via a path including an integrating condenser; a charging resistance and a coupling condenser connected in series between the emitter of said first transistor and the terminal of said integrating condenser remote from said source; a unilaterally conducting device connecting the common junction of said charging resistance and said coupling condenser to said point of reference potential; a second transistor having its collector-emitter path connected between the base of said first transistor and said source and means for rendering said second transistor periodically alternately conducting and non-conducting, the whole arrangement being such that when the said second transistor is non-conducting the integrating condenser is charged at substantially constant current from said coupling condenser and when said second transistor is conducting the integrating condenser is discharged and the coupling condenser recovers the charge which it has lost via a path including said unilaterally conducting device and the collector-emitter path of said first transistor.

The means for rendering the second transistor periodically alternately conducting and non-conducting may include means for applying input pulses between the base of said transistor and said point of reference potential. Alternatively said means may comprise means for applying input pulses between the base and emitter of said transistor. Each of these arrangements has its own advantages as will be made apparent hereafter.

FIGURE 2, which shows one embodiment in accordance with one feature of the invention, is identical with FIGURE 1 but for the addition of the diode D2 between the base and emitter of transistor T2, and the addition of the low resistance RX between the condenser C1 and earth. It will be seen that during the period $t_1$ the diode D2 is cut-off and therefore has substantially no effect on the operation of the circuit. During the period $t_2$ when the transistor T1 bottoms the emitter of transistor T2 is negative with respect to its base, due to the charge lost by condenser C2. The diode D2 therefore conducts and condenser C2 recovers its lost charge via the path including the diode D1 and D2, and transistor T1. As the resistance of this path is very low C2 re-charges very rapidly. As the charging current for condenser C2 is supplied through transistor T1 there is a consequent increase in the drive requirements thereof.

The provision of resistance RX, which is optional, ensures greater linearity at the beginning of the sawtooth. At very low current the equivalent emitter resistance of a transistor is very large, and under these conditions the gain of the transistor T2 is considerably less than unity, giving rise to distortion at the beginning of the sawtooth if the resistance RX is omitted. With RX in circuit, however, as soon as charging current begins to flow into condenser C1 the potential drop across RX causes the base of T2 to drop suddenly in potential, so that T2 is switched with sufficiently high current to prevent distortion. With constant charging current the potential across RX is constant throughout the sweep and therefore the linearity of the sawtooth is not adversely affected by the presence of RX.

FIGURE 3 shows an arrangement in accordance with the second and preferred feature of the invention. Because of the different connections, parts in this figure which are similar to those in FIGURES 1 and 2 carry the same references as in those figures but with a tick suffix.

In this arrangement the base of transistor T2′ is connected to the emitter of transistor T1′ and the condenser C1′ connected between the base of T2′ and the negative supply $-Vc$. One end of the charging resistor RC′ is connected to the emitter of T1′ and the junction of RC′ and C2′ is connected via the diode D1′ to earth. Input driving pulses are fed from a source of driving pulses (not shown) to the primary (also not shown) of a transformer whose secondary S is connected between the base and emitter of transistor T1′. This method of driving avoids the feedback effect which would occur due to the resistance RC were the driving pulses applied between the base and earth and is therefore advantageous where fast switching is required. It possesses the further advantage of not requiring such a large driving pulse.

When T1′ is non-conducting condenser C1′ is charged by condenser C2, through the resistance RC′, and the potential at the base of transistor T2′ increases linearly in a positive direction, the potential at the emitter of T2′ likewise increasing positively towards earth potential. When T1′ is made conducting condenser C1 discharges and the base of T2′ is now substantially at the potential of the negative supply $-Vc$. Consequently T2′ conducts very hard and C2′ is re-charged by means of the current through T2.

This arrangement has the following advantages over that of FIGURE 2.

(i) No increase in the driving requirements of the circuit is required in order to provide the re-charging current.

(ii) The linearity of the output sawtooth at the end of the sweep is increased due to the fact that with transistors as at present available the current gain $a'$ increases towards unity with decreasing current (apart from a sharp decrease at very low current).

(iii) No special provisions are required to ensure good linearity at the beginning of the sweep as the transistor current is high at this point.

(iv) When the drive is removed both transistors T1′ and T2′ are cut-off whereas with the arrangements of FIGURE 2 the base of T2 is positively biassed and care must be taken that T2 is not over dissipated.

If desired the driving pulses, in the arrangement of FIGURE 3, may be applied between the base of transistor T1′ and earth in the same manner as in FIGURE 2. Although this arrangement has the disadvantages, as pointed out above, that feedback takes place due to the resistance RC′ and that the driving requirements are thereby increased, it possesses the advantage that T1′ is now effectively a grounded collector transistor with its consequently higher input impedance and improved transient response.

I claim:

1. A substantially linear sweep circuit arrangement comprising a first transistor having a load resistance connected between its emitter and a point of reference potential, its collector connected to a source of direct current potential different from said reference potential and its base connected to said point of reference potential via a path including an integrating condenser; a charging resistance and a coupling condenser connected in series between the emitter of the first transistor and the terminal of said integrating condenser remote from the point of reference potential; a first diode connecting the common junction of the charging resistance and the coupling condenser to said source; a second transistor having its collector-emitter path connected between the base of said first transistor and said point of reference potential; means for rendering said second transistor periodically alternately conducting and non-conducting and a second diode connected between the base and emitter of said first transistor, the whole arrangement being such that when the second transistor is non-conducting the integrating condenser is charged at substantially constant current from said coupling condenser and when the second transistor is conducting the integrating condenser is discharged and the coupling condenser recovers the charge it has lost via a path including both said diodes and the collector-emitter path of said second transistor.

2. An arrangement as claimed in claim 1 wherein a further resistance is connected in series with said integrating condenser on the side thereof nearer said point of reference potential.

3. A substantially linear sweep circuit arrangement comprising a first transistor connected to produce across an output load between its emitter and a point of reference potential, a potential which is a replica of the potential on its base; means for determining the potential of said base in dependence on the charge in a condenser connected between said base and a source of direct current potential different from said reference potential, and which is charged at substantially constant current during the "sloping flank" of the saw-tooth waveform produced by the whole arrangement from a second condenser connected between the base and the output circuit; and a second transistor which is normally cut off but is arranged to be rendered conductive by timing pulses so as to discharge the first condenser during the "flyback" part of the saw-tooth waveform, the second condenser re-charging during these periods through a path including the collector-emitter path of said first transistor and excluding the output load.

4. An arrangement as claimed in claim 3 and comprising a first transistor having a load resistance connected between its emitter and a point of reference potential, its collector connected to a source of direct current potential different from said reference potential and its base connected to said source via path including an integrating condenser; a charging resistance and a coupling condenser connected in series between the emitter of said first transistor and the terminal of said integrating condenser remote from said source; a unilaterally conducting device connecting the common junction of said charging resistance and said coupling condenser to said point of reference potential; a second transistor having its collector-emitter path connected between the base of said first transistor and said source and means for rendering said second transistor periodically alternately conducting and non-conducting, the whole arrangement being such that when the said second transistor is non-conducting the integrating condenser is charged at substantially constant current from said coupling condenser and when said second transistor is conducting the integrating condenser is discharged and the coupling condenser recovers the charge which it has lost via a path including said unilaterally conducting device and the collector-emitter path of said first transistor.

5. An arrangement as claimed in claim 4 wherein the means for rendering the second transistor periodically alternately conducting and non-conducting include means for applying input pulses between the base of said transistor and said point of reference potential.

6. An arrangement as claimed in claim 4 wherein the means for rendering the second transistor periodically alternately conducting and non-conducting include means for applying input pulses between the base and emitter of said transistor.

7. A substantially linear sweep circuit comprising a first and a second transistor, the first transistor being connected to a load circuit so as to produce thereacross a potential which is a replica of its base potential, a first condenser, a second condenser, said second condenser being connected between the base electrode and the output circuit, means to charge said first condenser at substantially constant current from said second condenser during the sloping flank of the waveform produced by said circuit, means to apply the potential of said first condenser to said base electrode, means to render said second transistor non-conductive normally, means to apply timing pulses to said second transistor to render it conductive, means connecting said first condenser with the second transistor so that the first condenser is discharged during the flyback period of the waveform produced, a unilaterally conducting device, and means to connect said device in the charging circuit of the second condenser in series with the collector-emitter path of the second transistor.

UNITED STATES PATENTS

References Cited in the file of this patent

| | | |
|---|---|---|
| 2,574,253 | Duffy | Nov. 6, 1951 |
| 2,837,663 | Walz | June 3, 1958 |
| 2,892,952 | McVey | June 30, 1959 |